(12) United States Patent
Lung et al.

(10) Patent No.: US 10,536,000 B2
(45) Date of Patent: Jan. 14, 2020

(54) GRID INDEPENDENT OPERATION CONTROL UNIT, POWER CONDITIONER, AND GRID INDEPENDENT OPERATION CONTROL METHOD

(71) Applicant: TABUCHI ELECTRIC CO., LTD., Osaka-shi, Osaka (JP)

(72) Inventors: Chienru Lung, Osaka (JP); Hideki Hidaka, Amagasaki (JP)

(73) Assignee: TABUCHI ELECTRIC CO., LTD., Osaka (JP)

( * ) Notice: Subject to any disclaimer, the term of this patent is extended or adjusted under 35 U.S.C. 154(b) by 272 days.

(21) Appl. No.: 15/321,028

(22) PCT Filed: Feb. 10, 2016

(86) PCT No.: PCT/JP2016/053905
§ 371 (c)(1),
(2) Date: Dec. 21, 2016

(87) PCT Pub. No.: WO2017/138103
PCT Pub. Date: Aug. 17, 2017

(65) Prior Publication Data
US 2017/0288403 A1    Oct. 5, 2017

(51) Int. Cl.
*G05D 3/12*    (2006.01)
*G05D 5/00*    (2006.01)
(Continued)

(52) U.S. Cl.
CPC ............ *H02J 3/381* (2013.01); *G05B 13/048* (2013.01); *H02J 3/01* (2013.01); *H03H 7/0115* (2013.01); *H02J 3/383* (2013.01); *H02J 3/387* (2013.01)

(58) Field of Classification Search
CPC ... G05B 13/048; H02J 3/01; H02J 3/38; H02J 3/381; H02J 3/383; H02J 3/387;
(Continued)

(56) References Cited

U.S. PATENT DOCUMENTS 4,757,434 A * 7/1988 Kawabata ......... H02M 7/53873
363/132
5,442,538 A * 8/1995 Ikeda ................ H02M 7/53875
363/95
(Continued)

FOREIGN PATENT DOCUMENTS

JP    H10-313540 A    11/1998
JP    2013-165577 A    8/2013
JP    2014-075854 A    4/2014

*Primary Examiner* — Zhipeng Wang
(74) *Attorney, Agent, or Firm* — Oliff PLC

(57) ABSTRACT

A grid independent operation control unit includes a load current estimator to estimate a load current supplied to stand-alone power system in accordance with an output current of the inverter and an output voltage, and a feedback controller configured to PWM control the inverter at a duty ratio feedback calculated to cause the inverter to output an output voltage command value in accordance with the output voltage and the load current. The feedback controller is configured to PWM control the inverter at a duty ratio feedback calculated for output of a normalized output voltage command value obtained by normalizing the output voltage command value with the DC bus voltage in accordance with normalized output voltage obtained by normalizing the output voltage with the DC bus voltage and normalized load current obtained by normalizing the load current with the DC bus voltage.

17 Claims, 11 Drawing Sheets

(51) Int. Cl.
*G05D 9/00* (2006.01)
*G05D 11/00* (2006.01)
*G05D 17/00* (2006.01)
*H02J 3/38* (2006.01)
*G05B 13/04* (2006.01)
*H02J 3/01* (2006.01)
*H03H 7/01* (2006.01)

(58) Field of Classification Search
CPC .. H02M 1/126; H02M 7/5395; H03H 7/0115; Y02E 10/563; Y02E 40/40
See application file for complete search history.

(56) References Cited

U.S. PATENT DOCUMENTS

| | | | | |
|---|---|---|---|---|
| 2005/0219880 | A1* | 10/2005 | Nagai | H02M 7/537 363/131 |
| 2012/0032517 | A1* | 2/2012 | Ido | H02M 3/3376 307/77 |
| 2016/0181945 | A1* | 6/2016 | Ding | H02M 1/00 307/82 |
| 2017/0244317 | A1* | 8/2017 | Kondo | H02M 3/155 |

* cited by examiner

| Symbol | Parameter | Symbol | Parameter |
|---|---|---|---|
| $E^*_{sd.max}$ | 169.7 V | $L_f$ | 3.2 mH |
| $V_{dc}$ | 400 V | $C_f$ | 30 $\mu$F |
| $f_{sd}$ | 60 Hz | $R_c$ | 3.2 m$\Omega$ |
| $a$ | 1.1 | $b$ | 2 |
| $k$ | 1.5 | $P_{sd.rated}$ | 2000 W |
| Sampling frequency | 19.6 kHz | $T_1$ | 2ms |
| $T_2$ | 10s | | |

Fig. 9A

| Load condition | Manufactory | Load type | V / Hz | Rated load power |
|---|---|---|---|---|
| 1 | Ohm - electric | Vacuum cleaner | 120 V / 50, 60Hz | 600 W |
| 2 | National | Hair dryer | 120 V / 50, 60Hz | 700 W |
| 3 | National | Hair dryer | 120 V / 50, 60Hz | 1200 W |
| 4 | GE | Refrigerator | 120/60Hz | 127V/11.6A |

Fig. 9B

GRID INDEPENDENT OPERATION CONTROL UNIT, POWER CONDITIONER, AND GRID INDEPENDENT OPERATION CONTROL METHOD

TECHNICAL FIELD

The present invention relates to a grid independent operation control unit for a distributed power supply, a power conditioner, and a grid independent operation control method for a distributed power supply.

BACKGROUND ART

A distributed power supply such as a solar cell or a fuel cell includes a power conditioner configured to convert power in order to adapt a frequency and a voltage to a commercial system power supply for use in interconnection with the commercial system power supply. A hybrid distributed power supply obtained by including a storage battery to such a distributed power supply has also been attracting attention in recent years.

A power conditioner applicable to a hybrid distributed power supply includes a DC/DC converter configured to adjust a DC voltage of power generated by the distributed power supply to a predetermined DC voltage value, a bidirectional DC/DC converter (hereinafter, simply referred to as a "DC converter") configured to charge or discharge a storage battery, an inverter configured to convert a DC bus voltage connected with the bidirectional DC/DC converter to an AC voltage, an LC filter configured to remove a high frequency component from output of the inverter, and the like.

In a case where a shunt fault occurs on a distribution line for a distributed power supply in grid connected operation, or power transmission from a substation to the distribution line stops due to planned power outage or the like, that is, an isolated operation state is established, in order to prevent influence on operation of a sectionalizing switch and secure safety during handling of the distribution line, the power conditioner separates the distributed power supply from the distribution line.

The power conditioner converts DC power of the distributed power supply to AC power and controls to supply the power to an independent power system with no interconnection with a commercial power system.

The power conditioner includes a control unit configured to control a distributed power supply. The control unit includes a current control block configured to control an inverter to output an AC current in synchronization with a phase of a commercial power system voltage at commercial grid connected operation, and a voltage control block configured to control the inverter for output of a voltage at a predetermined level provided to a stand-alone power system upon power system separation.

The provided voltage at the predetermined level corresponds to a voltage for low-voltage customers prescribed in Electricity Business Act, Article 26 and the Ordinance for Enforcement of the Act, Article 44 in Japan, and falls within 101±6 V with respect to a standard voltage 100 V and within 202±20 V with respect to a standard voltage 200 V.

Patent Document 1 discloses an inverter device for a distributed power supply, configured to suppress, within a predetermined allowable range, variation in output voltage of the inverter device due to load variation at grid independent operation.

The inverter device includes a voltage control circuit provided with a first determination circuit configured to determine an output voltage set value with stepwise change to cause the inverter output voltage to fall within an allowable range in accordance with detection of a load current, and a second determination circuit configured to determinate the output voltage set value with stepwise change to cause the inverter output voltage to fall within the allowable range in accordance with detection of a load voltage. Upon grid interconnection, the voltage control circuit updates the output voltage set value with detection of a load current by the first determination circuit, brings a standby state of keeping the output voltage set value from occurrence of power system outage to cutoff of an interconnection switch, brings a standby state of updating the output voltage set value with detection of a load voltage by the second determination circuit since cutoff of the interconnection switch, switches from a current control mode to a voltage control mode, and then switches from the first determination circuit configured to transmit an output voltage command based on the output voltage set value with detection of the load current to the second determination circuit configured to transmit an output voltage command based on the output voltage set value with detection of the load voltage.

Patent Document 2 discloses a power conditioner including a current suppression circuit configured to limit an inrush current due to a load connected to a stand-alone power system so as to be less than a predetermined current value for securement of stable grid independent operation with suppression of the inrush current generated at the load connected to the stand-alone power system.

The inverter device for the distributed power supply disclosed in Patent Document 1 is required to include a dedicated load current sensor configured to measure a load current, to problematically lead to increase in cost for components including a peripheral circuit of the current sensor as well as for installation.

The power conditioner disclosed in Patent Document 2 includes the dedicated current suppression circuit for suppression of an inrush current and is required to include complicated control algorithm applicable to the current suppression circuit, also problematically leading to increase in component cost.

In view of the above, as disclosed in Patent Document 3, the inventors of the present application propose a grid independent operation control unit for a distributed power supply, configured to control to a stable output voltage without provision of any sensor for detection of a load current or any specific component even under a condition with an inrush current.

The grid independent operation control unit is for the distributed power supply including an inverter configured to convert generated DC power to AC power and an LC filter configured to remove a harmonic component from output of the inverter and configured to supply power to a stand-alone power system if a commercial system power supply has a voltage not more than a predetermined voltage. The grid independent operation control unit includes a load current estimator configured to estimate a load current $i_{load}$ supplied to the stand-alone power system in accordance with an output current $i_{inv}$ of the inverter and an output voltage $e_{sd}$, and feedback controls to cause the inverter to output an output voltage command value $e^*_{sd}$ in accordance with the output voltage $e_{sd}$ and the load current $i_{load}$.

The load current estimator is configured to estimate a branch current $i_c$ flowing to a capacitor of the LC filter in accordance with the output current $i_{inv}$ and the output voltage $e_{sd}$ and calculate the load current $i_{load}$ by subtracting the branch current $i_c$ from the output current $i_{inv}$.

The grid independent operation control unit for the distributed power supply feedback calculates to cause the inverter to output the output voltage command value $e^*_{sd}$ and calculates a duty ratio $u^*_d$ for PWM control of the inverter by dividing a result of the calculation by a DC bus voltage $V_{dc}$ in this case. The duty ratio $u^*_d$ occasionally fails to fall within the range of $-1<u^*_d<1$ due to decrease in DC bus voltage $V_{dc}$. There has thus been provided a limiter configured to limit the duty ratio $u^*_d$ into the range of $-1<u^*_d<1$.

CITATION LIST

Patent Literature

Patent Literature 1: JP 10-313540 A
Patent Literature 2: JP 2013-165577 A
Patent Literature 3: JP 2014.75854 A

SUMMARY OF INVENTION

Technical Problem

However, in the grid independent operation control unit disclosed in Patent Document 3, if power generated by a solar cell configuring the distributed power supply is not supplied promptly in an overload state of the stand-alone power system, an electrolytic capacitor connected to the DC bus voltage $V_{dc}$ may initially be discharged to a load to momentarily decrease the DC bus voltage $V_{dc}$.

Also in a hybrid distributed power supply including a storage battery, if a current discharged from the storage battery is not supplied promptly in an overload state of the stand-alone power system, the electrolytic capacitor connected to the DC bus voltage $V_{dc}$ may initially be discharged to the load to momentarily decrease the DC bus voltage $V_{dc}$.

Momentary decrease in stand-alone power system voltage $e_{sd}$ in an overload state causes decrease in branch current $i_c$ flowing to the capacitor obtained by the load current estimator and accordingly causes momentary increase in estimated value of the load current $i_{load}$. The calculated duty ratio $u^*_d$ is thus possibly kept at an upper limit value or close to the upper limit value limited by the limiter to problematically cause a continuous flow of an over current.

Consequently, if an overcurrent protection circuit incorporated in the inverter is actuated, the power conditioner stops, and is problematically not recovered unless reset operation is performed by a worker. In an exemplary overload state, an inrush current flows to a coil in a case where an inductive load is mainly connected.

In view of the above problems, it is an object of the present invention to provide a grid independent operation control unit, a power conditioner, and a grid independent operation control method, which achieve control to a stable output voltage with no provision of any sensor for detection of a load current or any specific component even in an overload state.

Solution to Problem

In order to achieve the object mentioned above, as recited in claim 1 of the patent claims, according to a first feature of a grid independent operation control unit of the present invention, the grid independent operation control unit is incorporated in a distributed power supply that includes an inverter configured to convert a received DC bus voltage $V_{dc}$ to an AC output voltage, and an LC filter configured to remove a harmonic component from output of the inverter and is configured to execute grid connected operation or grid independent operation. The grid independent operation control unit includes a load current estimator configured to estimate a load current $i_{load}$ supplied to stand-alone power system in accordance with the following mathematical expression, and an output current $i_{inv}$ of the inverter and an output voltage $e_{sd}$, and a feedback controller configured to PWM control the inverter at a duty ratio feedback calculated to cause the inverter to output an output voltage command value $e^*_{sd}$ in accordance with the output voltage $e_{sd}$ and the load current $i_{load}$, in which the feedback controller is configured to PWM control the inverter at a duty ratio $u^*_d$ feedback calculated for output of a normalized output voltage command value $x^*_{sd}$ obtained by normalizing the output voltage command value $e^*_{sd}$ with the DC bus voltage $V_{dc}$ in accordance with a normalized output voltage $x_{sd}$ obtained by normalizing the output voltage $e_{sd}$ with the DC bus voltage $V_{dc}$ and a normalized load current $x_{load}$ obtained by normalizing the load current $i_{load}$ with the DC bus voltage $V_{dc}$.

$$\begin{cases} i_{load} = i_{inv} - i_c \\ i_c = \dfrac{sC_f}{sR_cC_f + 1} \cdot e_{sd} \end{cases} \quad \text{[Expression 1]}$$

In order for output of an AC voltage within a predetermined voltage range to the stand-alone power system, the feedback controller controls the load current estimator to detect the output current $i_{inv}$ of the inverter and the output voltage $e_{sd}$ and estimate the load current $i_{load}$ supplied to the stand-alone power system in accordance with the detected values as indicated in [Expression 1], and controls the inverter to output the output voltage command value $e^*_{sd}$ in accordance with the detected output voltage $e_{sd}$ and the estimated load current $i_{Load}$. There is thus no need to provide any current sensor for detection of a load current. This configuration achieves decrease in component cost therefor. In [Expression 1], s is a Laplacian operator (Laplace transform).

Obtained in this case is the duty ratio $u^*_d$ feedback calculated from the normalized output voltage $x_{sd}$, the normalized load current $x_{load}$, and the normalized output voltage command value $x^*_{sd}$, which are obtained by normalizing the output voltage $e_{sd}$, the load current $i_{load}$, and the output voltage command value $e_{sd}$ with the DC bus voltage $V_{dc}$. Even in a case where the DC bus voltage $V_{dc}$ varies, the duty ratio $u^*_d$ is calculated in accordance with the varied value. The duty ratio $u^*_d$ is thus effectively suppressed from being kept at the upper limit value or close to the upper limit value with no specific limitation.

As recited in claim 2, according to a second feature of the grid independent operation control unit in addition to the first feature, the normalized output voltage command value $x^*_{sd}$ is limited in accordance with the following mathematical expression, with a coefficient a (a is a real number in a range of $1 \le a \le 2$) and a DC bus voltage $V_{dc.ini}$ immediately before start of grid independent operation.

$$x^*_{sd} = \min\left\{ \dfrac{e^*_{sd}}{V_{dc}}, a \cdot \dfrac{e^*_{sd}}{V_{dc.ini}} \right\} \quad \text{[Expression 2]}$$

The normalized output voltage command value $x^*_{sd}$ has a large value when the DC bus voltage $V_{dc}$ decreases momentarily to possibly generate an over current. In view of such a case, the normalized output voltage command value $x^*_{sd}$ has a regulated upper limit by $a \cdot (e^*_{sd}/V_{dc.ini})$ to effectively suppress an over current even under an irregular condition with momentary significant decrease in DC bus voltage $V_{dc}$. $V_{dc.ini}$ is a DC bus voltage immediately before the start of grid independent operation and thus has a high and stable value with no momentary stop. The coefficient a is used for adjustment of a suppression level.

As recited in claim 3, according to a third feature of the grid independent operation control unit in addition to the first or second feature, the normalized load current $x_{load}$ is limited in accordance with the following mathematical expression, with a coefficient b (b is a real number in a range of 1≤b≤2), rated output power $P_{sd.rated}$, and a maximum value $E^*_{sd.max}$ of a stand-alone power system voltage command value.

$$x_{load} = \min\left\{\frac{i_{load}}{V_{dc}}, 2b \cdot \frac{P_{sd.rated}}{E^*_{sd.max}}\right\} \quad \text{[Expression 3]}$$

The normalized load current $x_{load}$ has a large value when the DC bus voltage $V_{dc}$ decreases momentarily to possibly increase the normalized output voltage command value $x^*_{sd}$ and generate an over current. In view of such a case, the normalized load current $x_{load}$ has a regulated upper limit by $2b \cdot (P_{sd.rated}/E^*_{sd.max})$ to effectively suppress an over current by means of suppression of the normalized output voltage command value $x^*_{sd}$ even under an irregular condition with momentary significant decrease in DC bus voltage $V_{dc}$. $P_{sd.rated}$ is rated output power and $E^*_{sd.max}$ is the maximum value of the stand-alone power system voltage command value. Accordingly, $2P_{sd.rated}/E^*_{sd.max}$ is equal to a minimum current value satisfying the rated output power. The coefficient b is used for adjustment of a suppression level.

As recited in claim 4, according to a fourth feature of the grid independent operation control unit in addition to any one of the first to third features, the feedback controller includes an AC voltage controller configured to feedback calculate a normalized output current command value $x^*_{inv}$ obtained by normalizing an output current command value $i^*_{inv}$ of the inverter with the DC bus voltage $V_{dc}$ to keep the normalized output voltage $x_{sd}$ at the predetermined normalized output voltage command value $x^*_{sd}$, and an AC current controller configured to feedback calculate the duty ratio $u^*_d$ of the inverter to cause the inverter to output the normalized output voltage command value $x^*_{sd}$ in accordance with the normalized output current command value $x^*_{inv}$, a normalized output current $x_{inv}$ obtained by normalizing the output current $i_{inv}$ of the inverter with the DC bus voltage $V_{dc}$, and the normalized load current $x_{load}$.

The AC voltage controller executes PID control or the like to calculate the normalized output current command value $x^*_{inv}$ of the inverter in order to keep the normalized output voltage $x_{sd}$ at the normalized output voltage command value $x^*_{sd}$, and the normalized output current command value $x^*_{inv}$ is received by the AC current controller. The AC current controller executes PID control or the like to calculate the duty ratio $u^*_d$ of the inverter in order to cause the inverter to output the normalized output voltage command value $x^*_{sd}$ in accordance with the normalized output current command value $x^*_{inv}$, the normalized output current $x_{inv}$, and the normalized load current $x_{load}$. When the inverter is controlled at the duty ratio $u^*_d$, the output voltage $e_{sd}$ is controlled stably even with variation in current flowing to a load connected to the stand-alone power system.

As recited in claim 5, according to a fifth feature of the grid independent operation control unit in addition to any one of the first to fourth features, the load current estimator is configured to estimate a normalized branch current $x_c$ obtained by normalizing a branch current $i_c$ flowing to a capacitor of the LC filter with the DC bus voltage $V_{dc}$ in accordance with the normalized output current $x_{inv}$ obtained by normalizing the output current $i_{inv}$ of the inverter with the DC bus voltage $V_{dc}$ and the normalized output voltage $x_{sd}$, and calculate the normalized load current $x_{load}$ by subtracting the normalized branch current $x_c$ from the normalized output current $x_{inv}$.

The normalized branch current $x_c$ flowing to the capacitor of the LC filter is estimated in accordance with the normalized output current $x_{inv}$ and the normalized output voltage $x_{sd}$ of the LC filter, and the normalized load current $x_{load}$ is calculated by subtracting the normalized branch current $x_c$ from the normalized output current $x_{inv}$.

As recited in claim 6, according to a sixth feature of the grid independent operation control unit in addition to any one of the first to fifth features, the grid independent operation control unit further includes a first error handling unit configured to stop the inverter if the load current $i_{load}$ exceeds a maximum current $I_{max}$ of a switching element of the inverter during a first predetermined period immediately after start of grid independent operation.

If it is determined that an over load current flows momentarily when the stand-alone power system is connected with a load in accordance with the estimated value, the first error handling unit stops the inverter to protect the same. This configuration handles an exemplary case where the switching element of the inverter is possibly damaged by a large spike noise current generated within several msec. upon power supply to a DC load of a full bridge or a half bridge, as well as a shunt fault that cannot occur normally.

As recited in claim 7, according to a seventh feature of the grid independent operation control unit in addition to any one of the first to sixth features, the grid independent operation control unit further includes a second error handling unit configured to stop the inverter if power exceeds a power threshold more than the rated output power during a second predetermined period after elapse of the first predetermined period.

If it is determined that power exceeds the power threshold set to be more than the rated output power within the second predetermined period after elapse of the first predetermined period, the second error handling unit stops the inverter. This configuration achieves protection of the inverter by avoiding an influence of an inrush current flowing to an inductive load of an air conditioner, a cleaner, or the like.

As recited in claim 8, according to an eighth feature of the grid independent operation control unit in addition to any one of the first to seventh features, the distributed power supply further includes a storage battery and a DC converter configured to charge or discharge the storage battery, and the grid independent operation control unit further includes a DC feedback controller including a DC voltage controller configured to feedback calculate an output current command value $i^*_{BAT}$ of the DC converter to keep the DC bus voltage $V_{dc}$ at a predetermined target DC bus voltage command value $V^*_{dc}$ and a DC current controller configured to PWM control the DC converter at a duty ratio $d^*_{BAT}$ of the DC converter feedback calculated to cause the DC converter to output the target DC bus voltage command value $V^*_{dc}$ in accordance with the output current command value $i^*_{BAT}$ and an output current $i_{BAT}$ of the DC converter.

More stable power supply to the stand-alone power system is achieved by hybridization with a storage battery further incorporated in the distributed power supply such as a solar cell or a fuel cell and suppression of variation in power generated by a DC power generator through control of the DC converter connected to the storage battery. The DC voltage controller initially feedback calculates the output current command value $i^*_{BAT}$ of the DC converter to keep the DC bus voltage $V_{dc}$ at the predetermined target DC bus voltage command value $V^*_{dc}$. The DC feedback controller subsequently feedback controls the duty ratio $d^*_{BAT}$ of the DC converter to cause the DC converter to output the DC bus voltage command value $V^*_{dc}$ in accordance with the output current command value $i^*_{BAT}$ and the output current $i_{BAT}$ of the DC converter. The DC converter is PWM controlled at the duty ratio $d^*_{BAT}$.

As recited in claim 9, according to a feature of a power conditioner of the present invention, the power conditioner includes an inverter configured to convert a received DC bus voltage $V_{dc}$ to an AC output voltage, and an LC filter configured to remove a harmonic component from output of the inverter, and the output voltage of the inverter is controlled by the grid independent operation control unit having any one of the first to eighth features.

As recited in claim 10, according to a first feature of a grid independent operation control method of the present invention, the grid independent operation control method is executed by a grid independent operation control unit incorporated in a distributed power supply that includes an inverter configured to convert a received DC bus voltage $V_{dc}$ to an AC voltage, and an LC filter configured to remove a harmonic component from output of the inverter and is configured to execute grid connected operation or grid independent operation. The grid independent operation control method includes a load current estimation step of estimating a load current $i_{load}$ supplied to stand-alone power system in accordance with the following mathematical expression, and an output current $i_{inv}$ of the inverter and an output voltage $e_{sd}$, and a feedback control step of PWM controlling the inverter at a duty ratio feedback calculated to cause the inverter to output an output voltage command value $e_{sd}$ in accordance with the output voltage $e_{sd}$ and the load current $i_{load}$, in which the feedback control step includes PWM controlling the inverter at a duty ratio $u^*_d$ feedback calculated for output of a normalized output voltage command value $x^*_{sd}$ obtained by normalizing the output voltage command value $e_{sd}$ with the DC bus voltage $V_{dc}$ in accordance with a normalized output voltage $x_{sd}$ obtained by normalizing the output voltage $e_{sd}$ with the DC bus voltage $V_{dc}$ and a normalized load current $x_{load}$ obtained by normalizing the load current $i_{load}$ with the DC bus voltage $V_{dc}$.

$$\begin{cases} i_{load} = i_{inv} - i_c \\ i_c = \dfrac{sC_f}{sR_cC_f + 1} \cdot e_{sd} \end{cases} \quad \text{[Expression 4]}$$

As recited in claim 11, according to a second feature of the grid independent operation control method in addition to the first feature, the normalized output voltage command value $x^*_{sd}$ is limited in accordance with the following mathematical expression, with a coefficient a (a is a real number in a range of 1≤a≤2) and a DC bus voltage $V_{dc.ini}$ immediately before start of grid independent operation.

$$x^*_{sd} = \min\left\{\dfrac{e^*_{sd}}{V_{dc}}, a \cdot \dfrac{e^*_{sd}}{V_{dc.ini}}\right\} \quad \text{[Expression 5]}$$

As recited in claim 12, according to a third feature of the grid independent operation control method in addition to the first or second feature, the normalized load current $x_{load}$ is limited in accordance with the following mathematical expression, with a coefficient b (b is a real number in a range of 1≤b≤2), rated output power $P_{sd.rated}$, and a maximum value $E^*_{sd.max}$ of a stand-alone power system voltage command value.

$$x_{load} = \min\left\{\dfrac{i_{load}}{V_{dc}}, 2b \cdot \dfrac{P_{sd.rated}}{E^*_{sd.max}}\right\} \quad \text{[Expression 6]}$$

As recited in claim 13, according to a fourth feature of the grid independent operation control method in addition to any one of the first to third features, the feedback control step includes an AC voltage control step of feedback calculating a normalized output current command value $x^*_{inv}$ obtained by normalizing an output current command value $i^*_{inv}$ of the inverter with the DC bus voltage $V_{dc}$ to keep the normalized output voltage $x_{sd}$ at the predetermined normalized output voltage command value $x^*_{sd}$, and an AC current control step of feedback calculating the duty ratio $u^*_d$ of the inverter to cause the inverter to output the normalized output voltage command value $x^*_{sd}$ in accordance with the normalized output current command value $x^*_{inv}$, a normalized output current $x_{inv}$ obtained by normalizing the output current $i_{inv}$ of the inverter with the DC bus voltage $V_{dc}$, and the normalized load current $X_{load}$.

As recited in claim 14, according to a fifth feature of the grid independent operation control method in addition to any one of the first to fourth features, the load current estimation step includes estimating a normalized branch current $x_c$ obtained by normalizing a branch current $i_c$ flowing to a capacitor of the LC filter with the DC bus voltage $V_{dc}$ in accordance with the normalized output current $x_{inv}$ obtained by normalizing the output current $i_{inv}$ of the inverter with the DC bus voltage $V_{dc}$ and the normalized output voltage $x_{sd}$, and calculating the normalized load current $x_{load}$ by subtracting the normalized branch current $x_c$ from the normalized output current $x_{inv}$.

As recited in claim 15, according to a sixth feature of the grid independent operation control method in addition to any one of the first to fifth features, the grid independent operation control method further includes a first error handling step of stopping the inverter if the load current $i_{load}$ exceeds a maximum current $I_{max}$ of a switching element of the inverter during a first predetermined period immediately after start of grid independent operation.

As recited in claim 16, according to a seventh feature of the grid independent operation control method in addition to any one of the first to sixth features, the grid independent operation control method further includes a second error handling step of stopping the inverter if power exceeds a power threshold more than the rated output power during a second predetermined period after elapse of the first predetermined period.

As recited in claim 17, according to an eighth feature of the grid independent operation control method in addition to any one of the first to seventh features, the distributed power supply further includes a storage battery and a DC converter configured to charge or discharge the storage battery, and the grid independent operation control method further includes a DC feedback control step including a DC voltage control step of feedback calculating an output current command value $i^*_{BAT}$ of the DC converter to keep the DC bus voltage $V_{dc}$ at a predetermined target DC bus voltage command value $V^*_{dc}$ and a DC current control step of PWM controlling the DC converter at a duty ratio $d^*_{BAT}$ of the DC converter feedback calculated to cause the DC converter to output the target DC bus voltage command value $V^*_{dc}$ in accordance with the output current command value $i^*_{BAT}$ and an output current $i_{BAT}$ of the DC converter.

Advantageous Effects of Invention

As described above, the present invention provides the grid independent operation control unit, the power conditioner, and the grid independent operation control method, which achieve control to a stable output voltage with no provision of any sensor for detection of a load current or any specific component even in an overload state.

BRIEF DESCRIPTION OF DRAWINGS

FIG. 9(a) is an explanatory parameter chart for a supporting test on grid independent operation control algorithm.

FIG. 9(b) is an explanatory chart of a loading device connected to a stand-alone power system.

DESCRIPTION OF EMBODIMENTS

A grid independent operation control unit, a power conditioner incorporated in the grid independent operation control unit, and a grid independent operation control method according to the present invention will now be described below with reference to the drawings.

Figure 1:
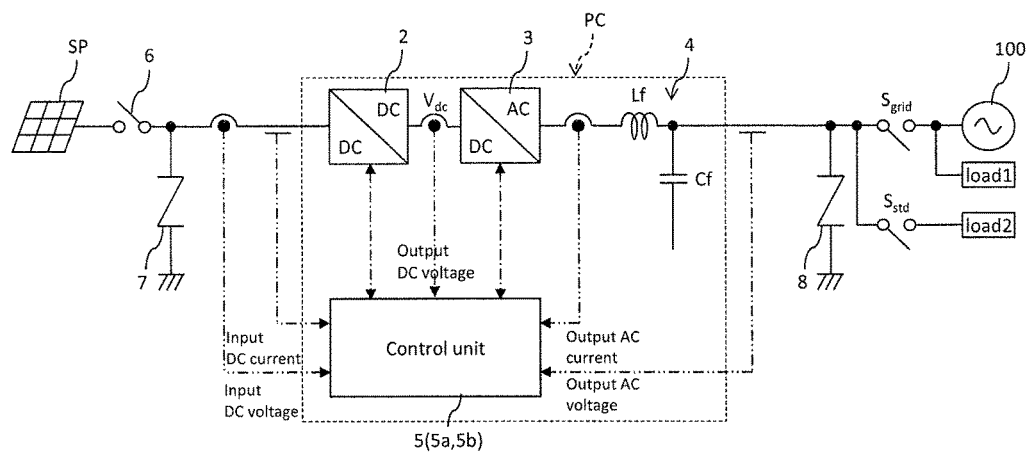
FIG. 1 is a configuration diagram of a distributed power supply provided with a grid independent operation control unit for a distributed power supply.

FIG. 1 depicts a solar power generator 1 exemplifying a distributed power supply. The solar power generator 1 includes a solar panel SP and a power conditioner PC connected with the solar panel SP. DC power generated by the solar panel SP is supplied to the power conditioner PC via a DC circuit breaker 6 and a surge suppressor 7.

The power conditioner PC includes a DC/DC converter 2 configured to raise a DC voltage of power generated by the solar panel SP to a predetermined DC link voltage $V_{dc}$, an inverter 3 configured to convert the raised DC link voltage $V_{dc}$ to a predetermined AC voltage, an LC filter 4 configured to remove a harmonic wave from the AC voltage outputted from the inverter 3, a control unit 5 configured to control the DC/DC converter 2 and the inverter 3, and the like.

AC power converted by the power conditioner PC is supplied to a local load (load1) configured to be interconnected with a commercial system power supply 100 via a surge suppressor 8 and a commercial grid interconnection relay $S_{grid}$ and connected to the commercial system power supply 100. When separated from the commercial system power supply 100, AC power is supplied to a load (load2) connected to a stand-alone power system, which is connected via a stand-alone power system relay $S_{std}$.

The control unit 5 in the power conditioner PC includes a converter controller 5a configured to control a boosting switch of the DC/DC converter 2, and an inverter controller 5b configured to control a switch forming a bridge of the inverter 3. These controllers each include a microcomputer, and a peripheral circuit having a memory element, an input/output element, and the like.

The converter controller 5a monitors an input voltage, an input current, and an output voltage of the DC/DC converter 2, and operates to execute MPPT control of operating the solar panel SP at a maximum power point and the like as well as control to raise the input voltage to a predetermined output voltage.

The inverter controller 5b includes functional blocks such as a current control block configured to control an output current of the inverter so as to synchronize with a phase of a commercial power system voltage upon commercial grid interconnection, a voltage control block configured to supply the stand-alone power system with AC power having a predetermined voltage upon power system separation, and an isolated operation detection block configured to detect whether or not grid interconnection is in an isolated operation state. The functional blocks including the voltage control block as part of the control unit 5 configure the grid independent operation control unit according to the present invention.

Figure 2:
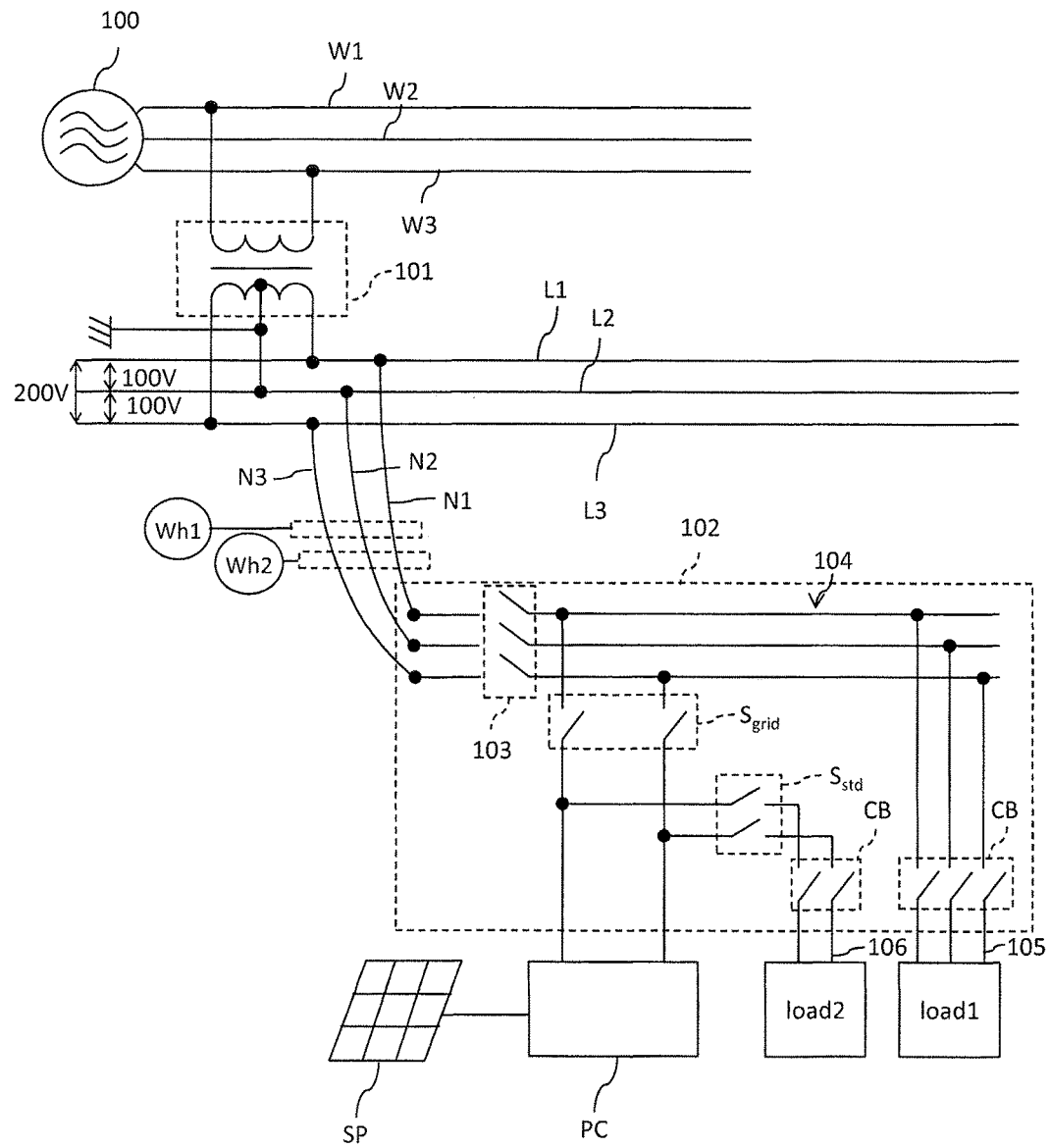
FIG. 2 is an explanatory diagram of a connection relation among a commercial system power supply, a distribution board, and the distributed power supply.

FIG. 2 depicts a connection relation between the commercial system power supply 100 and the solar power generator 1. High-tension distribution lines configured by three overhead wires W1, W2, and W3 transmit three-phase AC power of 6,600 V, and a pole transformer 101 mounted on a distribution pole adjacent to a consumer receives power from the two single-phase overhead wires W1 and W3 in the high-tension distribution lines.

The pole transformer 101 decreases the voltage of 6,600 V to a single-phase voltage of 200 V, an intermediate tap of 200 V is extracted as a neutral wire, and voltages of 100 V and 200 V are obtained between one of the wires and the neutral wire and between the wires, respectively. The neutral wire is grounded at a position close to the distribution pole, by being connected with a neutral wire grounding electrode.

The pole transformer 101 outputs a transformed voltage to low-tension distribution lines L1, L2, and L3 laid at the distribution pole. The pole transformer 101 is connected, via a master ground fault circuit interrupter 103 and the like, to a main circuit 104 provided on a local distribution board 102 of the consumer by way of low-tension incoming wires N1, N2, and N3. The low-tension incoming wires are connected with a power purchase watt—hour meter Wh1 and power selling watt—hour meter Wh2.

The main circuit 104 is connected with feeder wires 105 via a contact breaker CB and is configured to supply power from the feeder wires 105 to the local load load1. The power conditioner PC in the solar power generator 1 has an output terminal that is configured to be connected to the main circuit 104 via the commercial grid interconnection relay $S_{grid}$ and to supply power also to the load load2 connected to the stand-alone power system, which is connected to feeder wires 106 of the stand-alone power system via the stand-alone power system relay $S_{std}$ and a contact breaker CB. The stand-alone power system relay $S_{std}$ and the contact breaker CB are not limitedly mounted on the local distribution board 102 for the commercial power system.

The present embodiment exemplifies the power conditioner PC configured to output a single-phase three-wire AC voltage of 200 V at commercial grid connected operation and output a single-phase AC voltage of 100 V at grid independent operation. The power conditioner PC is alternatively configured to output a single-phase three-wire AC voltage of 200 V at grid independent operation.

The current control block of the inverter controller 5b closes the commercial grid interconnection relay $S_{grid}$ and controls an output current of the inverter so as to synchronize with a phase of a power system voltage at commercial grid connected operation, and opens the commercial grid interconnection relay $S_{grid}$ to be separated from the system when the isolated operation detection block detects the isolated operation state.

Description will continue with reference to FIG. 1 again. When the isolated operation detection block of the inverter controller 5b detects the isolated operation state and the commercial grid interconnection relay $S_{grid}$ is opened, the voltage control block functioning as the grid independent operation control unit closes the stand-alone power system relay $S_{std}$ and outputs an AC voltage of 100 V (more precisely, an AC voltage of 101±6 V) to the stand-alone power system.

If an output voltage fails to fall within the range of 101±6 V of an AC voltage due to variation in load current while the power conditioner PC supplies power to the load load2 connected to the stand-alone power system, the load load2 does not operate stably.

The grid independent operation control unit thus controls the inverter 3 in order to stabilize an output voltage regardless of variation in load current. Details will be described below.

Figure 3:
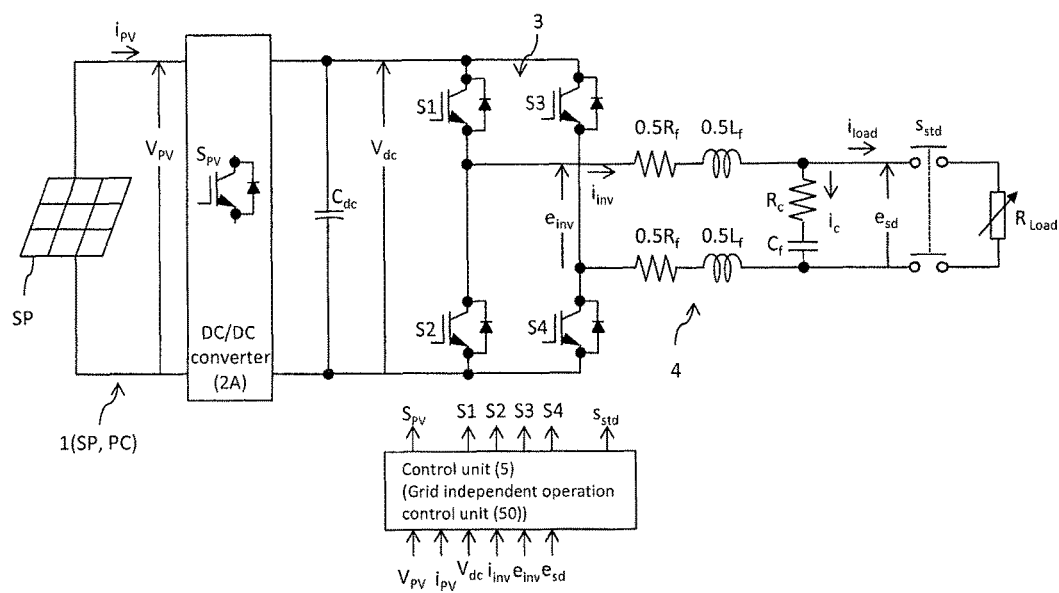
FIG. 3 is an explanatory circuit diagram of a power conditioner to be controlled by the grid independent operation control unit.

FIG. 3 depicts a grid independent operation control unit 50 and an equivalent circuit including a boosting DC/DC converter 2A for power generation at the solar panel SP, the inverter 3, and the LC filter 4. According to FIG. 3, in order for utilization of natural energy generated by the solar panel SP, the boosting DC/DC converter 2A is constantly subjected to maximum output power control (MPPT control) or CV mode control.

As to reference signs in FIG. 3, $V_{PV}$ denotes an input voltage of the solar panel SP, $i_{PV}$ denotes an output current of the solar panel SP, $V_{dc}$ denotes a DC link voltage, $C_{dc}$ denotes an electrolytic capacitor for a DC link voltage, $S_1$ to $S_4$ denote switching elements of the inverter 3, $e_{inv}$ denotes an output voltage of the inverter 3, $i_{inv}$ denotes an output current of the inverter 3, $L_f$ and $C_f$ each denote an LC filter, $R_f$ denotes internal resistance of an inductor $L_f$, $R_c$ denotes internal resistance of an AC capacitor $C_f$, $e_{sd}$ denotes an output voltage of the LC filter 4 at grid independent operation, $i_e$ denotes a current flowing to the AC capacitor $C_f$, $i_{load}$ denotes a load current, and $R_{load}$ denotes an AC load. A film capacitor is preferably adopted as the capacitor, though the capacitor is not limited to the film capacitor.

[Expression 7] is obtained in accordance with the Kirchhoff's voltage law and [Expression 8] is obtained in accordance with the Kirchhoff's current law. In the mathematical expression, $u_d$ is a PWM duty of single-phase inverter output.

$$\left. \begin{array}{l} e_{inv} = L_f \dfrac{di_{inv}}{dt} + R_f i_{inv} + e_{sd} \\ u_d \cdot V_{dc} = L_f \dfrac{di_{inv}}{dt} + R_f i_{inv} + e_{sd} \end{array} \right\} \quad \text{[Expression 7]}$$

$$i_{inv} = C_f \dfrac{de_{sd}}{dt} + i_{load} \quad \text{[Expression 8]}$$

[Expression 9] is obtained by indicating the current in [Expression 8] with a command value.

$$i^*_{inv} = C_f \dfrac{de_{sd}}{dt} + i_{load} \quad \text{[Expression 9]}$$

The load current $i_{load}$ in [Expression 8] is obtained in accordance with [Expression 10]. In the mathematical expression, $i_c$ is a current flowing to the capacitor $C_f$ configuring the LC filter 4. The current $i_c$ is estimated from the capacitor $C_f$, the internal resistance $R_c$, and the output voltage $e_{sd}$ at grid independent operation, as indicated in [Expression 11].

$$i_{load} = i_{inv} - i_c \quad \text{[Expression 10]}$$

$$i_c = \dfrac{sC_f}{sR_cC_f + 1} \cdot e_{sd} \quad \text{[Expression 11]}$$

[Expression 12] is obtained by indicating [Expression 7] with a command value.

$$u^*_d \cdot V_{dc} = L_f \dfrac{di_{inv}}{dt} + R_f i_{inv} + e^*_{sd} \quad \text{[Expression 12]}$$

Even without provision of any current sensor for detection of the load current $i_{load}$, by detecting the output current $i_{inv}$ of the inverter 3 and the output voltage $e_{sd}$ of the LC filter 4, the current $i_c$ flowing to the capacitor $C_f$ is estimated from the values in accordance with [Expression 11]. The load current $i_{load}$ is obtained from the estimated value. In [Expression 11], s is a Laplacian operator (Laplace transform).

The grid independent operation control unit 50 is configured to control an output voltage of the inverter 3 at grid independent operation in accordance with the estimated value of the load current $i_{load}$.

Figure 4:
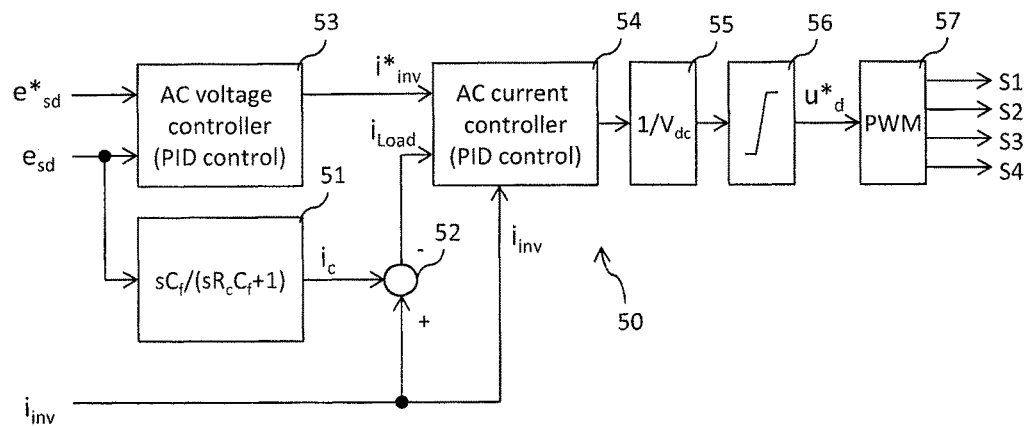
FIG. 4 is an explanatory view of conventional grid independent operation control algorithm.

FIG. 4 depicts a flow of conventional voltage control algorithm (the algorithm disclosed in Patent Document 3) executed by the grid independent operation control unit 50. The grid independent operation control unit 50 includes load current estimators 51 and 52 as well as feedback controllers 53, 54, and 55.

The load current estimators 51 and 52 are blocks configured to estimate the load current $i_{load}$ supplied to the stand-alone power system in accordance with the output current $i_{inv}$ of the inverter 3 and the output voltage $e_{sd}$ of the LC filter 4.

The feedback controllers 53, 54, and 55 are blocks configured to feedback control to cause the inverter 3 to output an output voltage command value $e^*_{sd}$ to the load in accordance with the output voltage $e_{sd}$ and the load current $i_{load}$.

Specifically, the feedback controllers 53, 54, and 55 include an AC voltage controller 53 and AC current controllers 54 and 55. The AC voltage controller 53 is configured to feedback calculate to keep the output voltage $e_{sd}$ at the predetermined output voltage command value $e^*_{sd}$ and calculate an output current command value $i^*_{inv}$ of the inverter 3. The AC current controllers 54 and 55 are configured to feedback calculate to cause the inverter 3 to output the output voltage command value $e^*_{sd}$ to the load in accordance with the output current command value $i^*_{inv}$ thus calculated, the output current $i_{inv}$, and the load current $i_{Load}$ and calculate a duty $u^*_d$ of the inverter.

PID calculation is preferably applied as feedback calculation. The AC voltage controller 53 is configured to set the output current command value $i^*_{inv}$ as a linear function for multiplying a difference (deviation) between the output voltage $e_{sd}$ and the output voltage command value $e^*_{sd}$ by a proportional gain $K_{ip}$.

The AC current controller 54 is configured to set the duty $u^*_d$ as a linear function for multiplying a difference (deviation) between the output current $i_{inv}$ and the output current command value by the proportional gain $K_{ip}$. Control responsiveness is improved by regarding the load current $i_{load}$ assumed in this case as a disturbance and setting the proportional gain $K_{ip}$ so as to be variable in accordance with the magnitude of the disturbance. In any of the above cases, PID control can include only proportional control or can also include differential control or integral control in combination with the proportional control.

The output voltage $e_{inv}$ of the inverter 3 is obtained as $e_{inv} = u^*_d \cdot V_{dc}$ in accordance with [Expression 7] and [Expression 12], so that the duty ratio $u^*_d$ obtained by dividing output of the AC current controller 54 by the DC bus voltage $V_{dc}$ as a final control value is received by a PWM controller 57, the switching elements $S_1$ to $S_4$ of the inverter 3 are PWM controlled, and an AC voltage is outputted, from which harmonic noise is removed by the LC filter 4. There is actually provided a limiter 56 configured to limit a value obtained by dividing the output of the AC current controller 54 by the DC bus voltage $V_{dc}$ so as to fall within the range of $-1 < u^*_d < 1$.

As described earlier, if an inrush current flows to an inductive load of an air conditioner, a cleaner, or the like at the start of grid independent operation into an overload state and power generated by a solar cell is not supplied promptly, the electrolytic capacitor connected to the DC bus voltage $V_{dc}$ may initially be discharged to the load to momentarily decrease the DC bus voltage $V_{dc}$.

This causes decrease in branch current $i_c$ flowing to the capacitor $C_f$ obtained by the load current estimators 51 and 52 and accordingly causes momentary increase in estimated value of the load current $i_{load}$. The calculated duty ratio $u^*_d$ is thus possibly kept at an upper limit value or close to the upper limit value limited by the limitation to cause a continuous flow of an over current.

Figure 5:
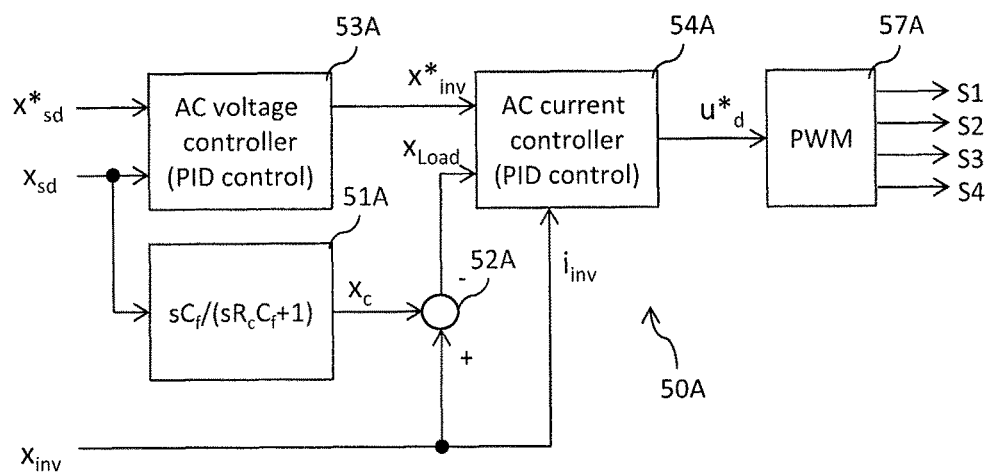
FIG. 5 is an explanatory view of grid independent operation control algorithm according to the present invention.

FIG. 5 depicts a grid independent operation control unit 50A according to the present invention, having a solution to this problem. The grid independent operation control unit 50A includes feedback controllers 53A and 54A configured to PWM control the inverter at the duty ratio $u^*_d$ feedback calculated for output of a normalized output voltage command value $x^*_{sd}$ obtained by normalizing the output voltage command value $e^*_{sd}$ with the DC bus voltage $V_{dc}$ in accordance with a normalized output voltage $x_{sd}$ obtained by normalizing the output voltage $e_{sd}$ with the DC bus voltage $V_{dc}$ and a normalized load current $x_{load}$ obtained by normalizing the load current $i_{load}$ with the DC bus voltage $V_{dc}$.

[Expression 13] includes arithmetic expressions for normalization, and [Expression 14] indicates the Kirchhoff's voltage law after normalization.

$$x^*_{sd} = \frac{e^*_{sd}}{V_{dc}}, \; x_{sd} = \frac{e_{sd}}{V_{dc}}, \; x^*_{inv} = \frac{i^*_{inv}}{V_{dc}},$$
$$x_{inv} = \frac{i_{inv}}{V_{dc}}, \; x_c = \frac{i_c}{V_{dc}}, \; x_{load} = \frac{i_{Load}}{V_{dc}}$$
[Expression 13]

$$\left.\begin{array}{l} x^*_{inv} = C_f \dfrac{dx_{sd}}{dt} + x_{load} \\[4pt] u^*_d = L_f \dfrac{dx_{inv}}{dt} + R_f x_{inv} + x^*_{sd} \end{array}\right\}$$
[Expression 14]

This configuration enables obtaining the duty ratio $u^*_d$ feedback calculated from the normalized output voltage $x_{sd}$, the normalized load current $x_{load}$, and the normalized output voltage command value $x^*_{sd}$, which are obtained by normalizing the output voltage $e_{sd}$, the load current $i_{load}$, and the output voltage command value $e^*_{sd}$ with the DC bus voltage $V_{dc}$, respectively. Even with variation in DC bus voltage $V_{dc}$, the duty ratio $u^*_d$ is calculated from the varied value and is thus effectively suppressed from being kept at the upper limit value or close to the upper limit value with no specific limitation.

Specifically, the feedback controller includes an AC voltage controller 53A configured to feedback calculate a normalized output current command value $x^*_{inv}$ obtained by normalizing the output current command value $i^*_{inv}$ of the inverter with the DC bus voltage $V_{dc}$ to keep the normalized output voltage $x_{sd}$ at the predetermined normalized output voltage command value $x^*_{sd}$, and an AC current controller 54A configured to feedback calculate the duty ratio $u^*_d$ of the inverter to cause the inverter to output the normalized output voltage command value $x^*_{sd}$ in accordance with a normalized output current $x_{inv}$ and the normalized load current $x_{load}$ obtained by normalizing the normalized output current command value $x^*_{inv}$ and the output current $i_{inv}$ of the inverter with the DC bus voltage $V_{dc}$.

Load current estimators 51A and 52A are configured to estimate a normalized branch current $x_c$ obtained by normalizing the branch current $i_c$ flowing to the capacitor of the LC filter with the DC bus voltage $V_{dc}$ in accordance with the normalized output current $x_{inv}$ obtained by normalizing the output current $i_{inv}$ of the inverter with the DC bus voltage $V_{dc}$ and the normalized output voltage $x_{sd}$, and calculate the normalized load current $X_{load}$ by subtracting the normalized branch current $x_c$ from the normalized output current $x_{inv}$.

The AC voltage controller 53A executes PID control calculation or the like to obtain the normalized output current command value $x^*_{inv}$ of the inverter in order to keep the normalized output voltage $x_{sd}$ at the normalized output voltage command value $x^*_{sd}$, and the normalized output current command value $x^*_{inv}$ is received by the AC current controller 54A.

The AC current controller 54A executes PID control calculation or the like to calculate the duty ratio $u^*_d$ to cause the inverter to output the normalized output voltage command value $x^*_{sd}$ in accordance with the normalized output current command value $x^*_{inv}$, the normalized output current $x_{inv}$, and the normalized load current $x_{load}$.

The PWM controller 57 controls the inverter at the duty ratio $u^*_d$. The output voltage $e_{sd}$ is thus controlled stably even in an overload state where a current flowing to the load connected to the stand-alone power system varies widely. PID calculation is preferably applicable to fundamental algorithm for feedback calculation similarly to the description with reference to FIG. 4.

The AC voltage controller 53A is configured to set the normalized output current command value $x^*_{inv}$ as a linear function for multiplying a difference (deviation) between the normalized output voltage $x_{sd}$ and the normalized output voltage command value $x^*_{sd}$ by the proportional gain $K_{ip}$.

The AC current controller 54A is configured to set the duty $u^*_d$ as a linear function for multiplying a difference (deviation) between the normalized output current $x_{inv}$ and the normalized output current command value $x^*_{inv}$ by the proportional gain $K_{ip}$. Control responsiveness is improved by regarding the normalized load current $x_{load}$ assumed in this case as a disturbance and setting the proportional gain $K_{ip}$ so as to be variable in accordance with the magnitude of the disturbance.

The AC voltage controller 53A is preferably configured to limit the normalized output voltage command value $x^*_{sd}$ in accordance with [Expression 15]. In [Expression 15], a coefficient a is a real number in the range of 1≤a≤2, and $V_{dc.ini}$ is a DC bus voltage immediately before the start of grid independent operation.

$$x^*_{sd} = \min\left\{\frac{e^*_{sd}}{V_{dc}}, a \cdot \frac{e^*_{sd}}{V_{dc.ini}}\right\}$$ [Expression 15]

The normalized output voltage command value $x^*_{sd}$ has a large value when the DC bus voltage $V_{dc}$ decreases momentarily to possibly generate an over current. In view of such a case, the normalized output voltage command value $x^*_{sd}$ has a regulated upper limit by $a \cdot (e^*_{sd}/V_{dc.ini})$ to effectively suppress an over current even under an irregular condition with momentary significant decrease in DC bus voltage $V_{dc}$. $V_{dc.ini}$ is a DC bus voltage immediately before the start of grid independent operation and thus has a high and stable value with no momentary stop. The coefficient a is used for adjustment of a suppression level and is set to a=1.1 in the present embodiment.

The AC current controller 54A is preferably configured to limit the normalized load current $x_{load}$ in accordance with [Expression 16]. In [Expression 16], a coefficient b is a real number in the range of 1≤b≤2, $P_{sd.rated}$ is rated output power, and $E^*_{sd.max}$ is a maximum value of a stand-alone power system voltage command value.

$$x_{load} = \min\left\{\frac{i_{load}}{V_{dc}}, 2b \cdot \frac{P_{sd.rated}}{E^*_{sd.max}}\right\}$$ [Expression 16]

Similarly to the above, the normalized load current $X_{load}$ has a large value when the DC bus voltage $V_{dc}$ decreases momentarily to possibly increase the normalized output voltage command value $x^*_{sd}$ and generate an over current. In view of such a case, the normalized load current $x_{load}$ has a regulated upper limit by $2b \cdot (P_{sd.rated}/E^*_{sd.max})$ to effectively suppress an over current by means of suppression of the normalized output voltage command value $x^*_{sd}$ even under an irregular condition with momentary significant decrease in DC bus voltage $V_{dc}$. $P_{sd.rated}$ is rated output power and $E^*_{sd.max}$ is the maximum value of the stand-alone power system voltage command value. Accordingly, $2P_{sd.rated}/E^*_{sd.max}$ is equal to a minimum current value satisfying the rated output power. The coefficient b is used for adjustment of a suppression level and is set to b=2 in the present embodiment.

Figure 6:
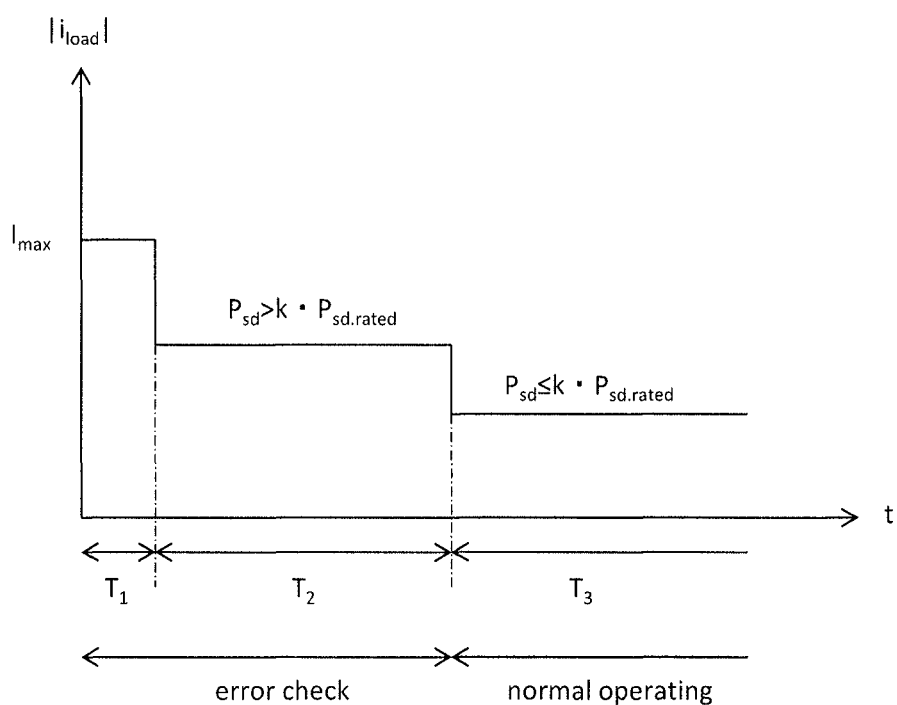
FIG. 6 is an explanatory graph of error checking.

As indicated in FIG. 6, the grid independent operation control unit 50A includes a first error handling unit configured to stop the inverter if the load current $i_{load}$ exceeds a maximum current $I_{max}$ of the switching element of the inverter during a first predetermined period $T_1$ immediately after the start of grid independent operation (1 to 2 msec. in the present embodiment).

The grid independent operation control unit 50A further includes a second error handling unit configured to stop the inverter if power exceeds a power threshold $k \cdot P_{sd.rated}$ more than the rated output power $P_{sd.rated}$ during a second predetermined period $T_2$ after elapse of the first predetermined period $T_1$. The coefficient k is a real number in the range of 1.5≤k≤2.

The first and second error handling units have only to be included in the grid independent operation control unit 50A, and are alternatively incorporated in the feedback controllers 53A or 54A.

If it is determined that an over load current flows momentarily when the stand-alone power system is connected with a load in accordance with the estimated value, the first error handling unit stops the inverter to protect the same.

This configuration handles an exemplary case where the switching element of the inverter is possibly damaged by a large spike noise current generated within several msec. upon power supply to a DC load including a full bridge or half bridge rectifier, as well as a shunt fault that cannot occur normally. The first predetermined period is appropriately set to at most 10 msec.

If it is determined that power exceeds the power threshold set to be more than the rated output power within the second predetermined period after elapse of the first predetermined period, the second error handling unit stops the inverter.

This configuration achieves protection of the inverter by avoiding an influence of an inrush current flowing to an inductive load of an air conditioner, a cleaner, or the like.

Figure 7:
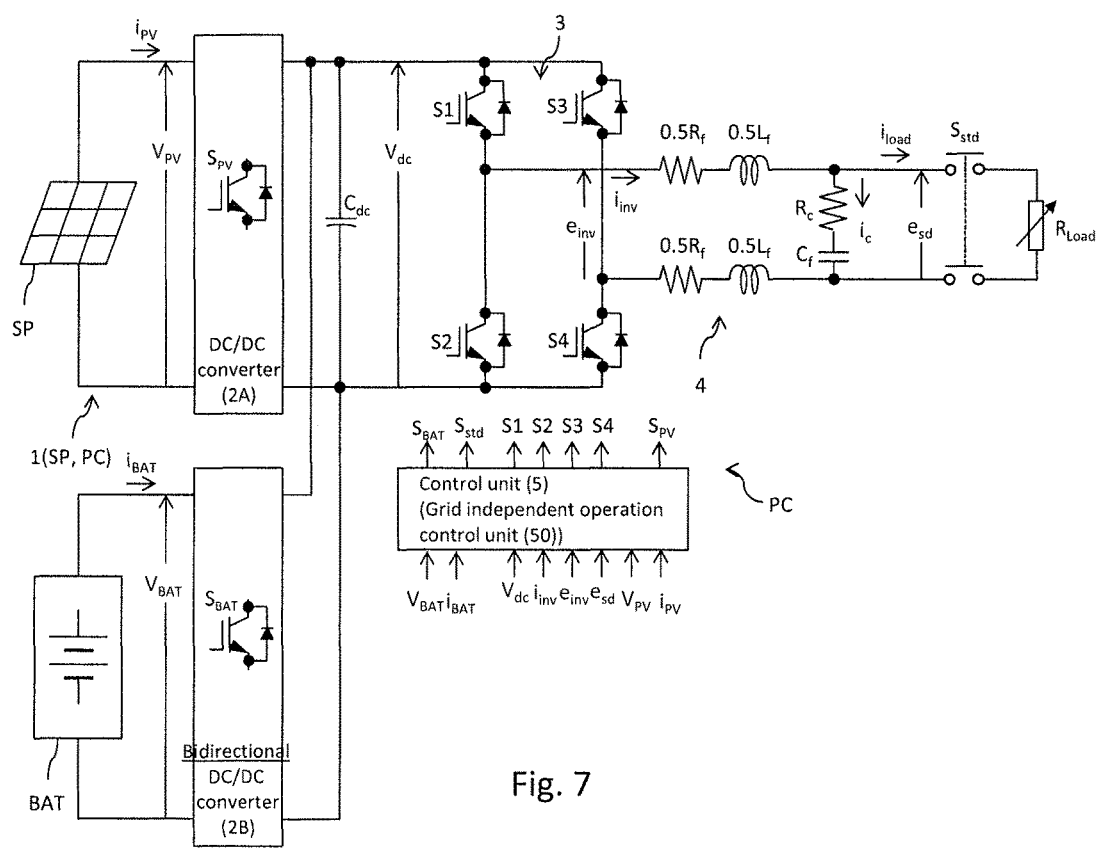
FIG. 7 is an explanatory circuit diagram of a power conditioner to be controlled by a grid independent operation control unit according to another embodiment.

As depicted in FIG. 7, preferably, the distributed power supply 1 further includes a storage battery BAT such as a lithium ion battery, and the power conditioner PC is provided with a bidirectional step-up/down DC/DC converter 2B (hereinafter, also simply referred to as a "DC converter 2B") configured to charge or discharge the storage battery BAT and a converter controller configured to control the DC converter 2B.

Even in a case where power generated by the solar panel SP varies and the DC/DC converter 2A has a varied output voltage, the DC converter 2B stabilizes the DC bus voltage Vdc.

Figure 8:
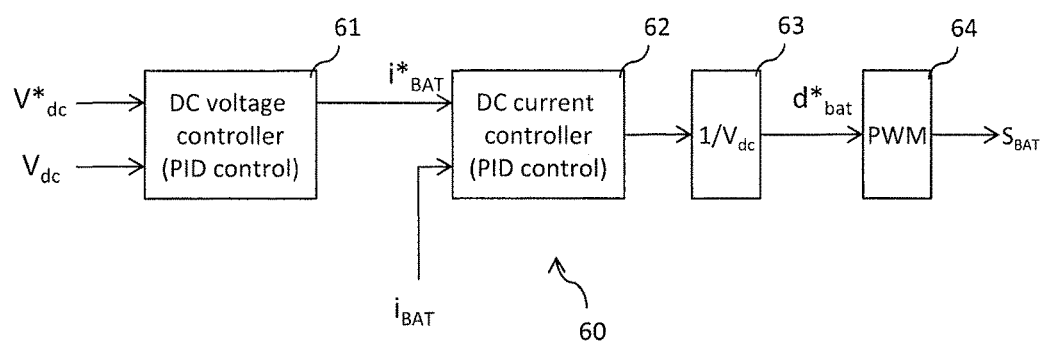
FIG. 8 is an explanatory view of grid independent operation control algorithm for a DC converter connected to a storage battery according to the other embodiment.

As depicted in FIG. 8, the grid independent operation control unit 50 includes a converter controller 60 that is provided with a DC feedback controller having a DC voltage controller 61 and DC current controllers 62 and 63, and a PWM controller 64 configured to control a switch $S_{BAT}$ of the DC converter 2B.

The DC voltage controller 61 is configured to feedback calculate an output current command value $i^*_{BAT}$ of the DC converter to keep the DC bus voltage $V_{dc}$ at a predetermined target DC bus voltage command value $V^*_{dc}$.

The DC current controllers 62 and 63 are configured to feedback calculate a control value $V_{dc} \cdot d^*_{BAT}$ to cause the DC converter 2B to output the target DC bus voltage command value $V^*_{dc}$ in accordance with the output current command value $i^*_{BAT}$ and the output current $i_{BAT}$ of the DC converter 2B, and calculate a duty ratio $d^*_{BAT}$ for PWM control by dividing the control value by the DC bus voltage $V_{dc}$.

The grid independent operation control unit 50 described above executes the grid independent operation control method including a load current estimation step of estimating the load current $i_{load}$ supplied to the stand-alone power system in accordance with the output current $i_{inv}$ of the inverter and the output voltage $e_{sd}$ of the LC filter, and a feedback control step of PWM controlling the inverter at the duty ratio feedback calculated to cause the inverter to output the output voltage command value $e^*_{sd}$ in accordance with the output voltage $e_{sd}$ and the load current $i_{load}$.

The feedback control step includes PWM controlling the inverter at the duty ratio $u^*_d$ feedback calculated for output of the normalized output voltage command value $x^*_{sd}$ obtained by normalizing the output voltage command value $e_{sd}$ with the DC bus voltage $V_{dc}$ in accordance with the normalized output voltage $x_{sd}$ obtained by normalizing the output voltage $e_{sd}$ with the DC bus voltage $V_{dc}$ and the normalized load current $x_{load}$ obtained by normalizing the load current $i_{load}$ with the DC bus voltage $V_{dc}$.

The normalized output voltage command value $x^*_{sd}$ is limited in accordance with [Expression 15] with the coefficient a (a is a real number in the range of 1≤a≤2) and the DC bus voltage $V_{dc.ini}$ immediately before the start of grid independent operation.

The normalized load current $X_{load}$ is limited in accordance with [Expression 16], with the coefficient b (b is a real number in the range of 1≤b≤2), the rated output power $P_{sd.rated}$, and the maximum value $E^*_{sd.max}$ of the stand-alone power system voltage command value.

The feedback control step includes an AC voltage control step and an AC current control step.

The AC voltage control step includes feedback calculating the normalized output current command value $x^*_{inv}$ obtained by normalizing the output current command value $i^*_{inv}$ of the inverter with the DC bus voltage $V_{dc}$ to keep the normalized output voltage $x_{sd}$ at the predetermined normalized output voltage command value $x^*_{sd}$.

The AC current control step includes feedback calculating the duty ratio $u^*_d$ of the inverter to cause the inverter to output the normalized output voltage command value $x^*_{sd}$ in accordance with the normalized output current command value $x^*_{inv}$, the normalized output current $x_{inv}$ obtained by normalizing the output current $i_{inv}$ of the inverter with the DC bus voltage $V_{dc}$, and the normalized load current $x_{load}$.

The load current estimation step includes estimating the normalized branch current $x_c$ obtained by normalizing the branch current $i_c$ flowing to the capacitor of the LC filter with the DC bus voltage $V_{dc}$ in accordance with the normalized output current $x_{inv}$ obtained by normalizing the output current $i_{inv}$ of the inverter with the DC bus voltage $V_{dc}$ and the normalized output voltage $x_{sd}$, and calculating the normalized load current $x_{load}$ by subtracting the normalized branch current $x_c$ from the normalized output current $x_{inv}$.

The method further includes a first error handling step of stopping the inverter if the load current $i_{load}$ exceeds the maximum current $I_{max}$ of the switching element of the inverter during the first predetermined period immediately after the start of grid independent operation, and a second error handling step of stopping the inverter if power exceeds the power threshold more than the rated output power during the second predetermined period after elapse of the first predetermined period.

Figure 10:
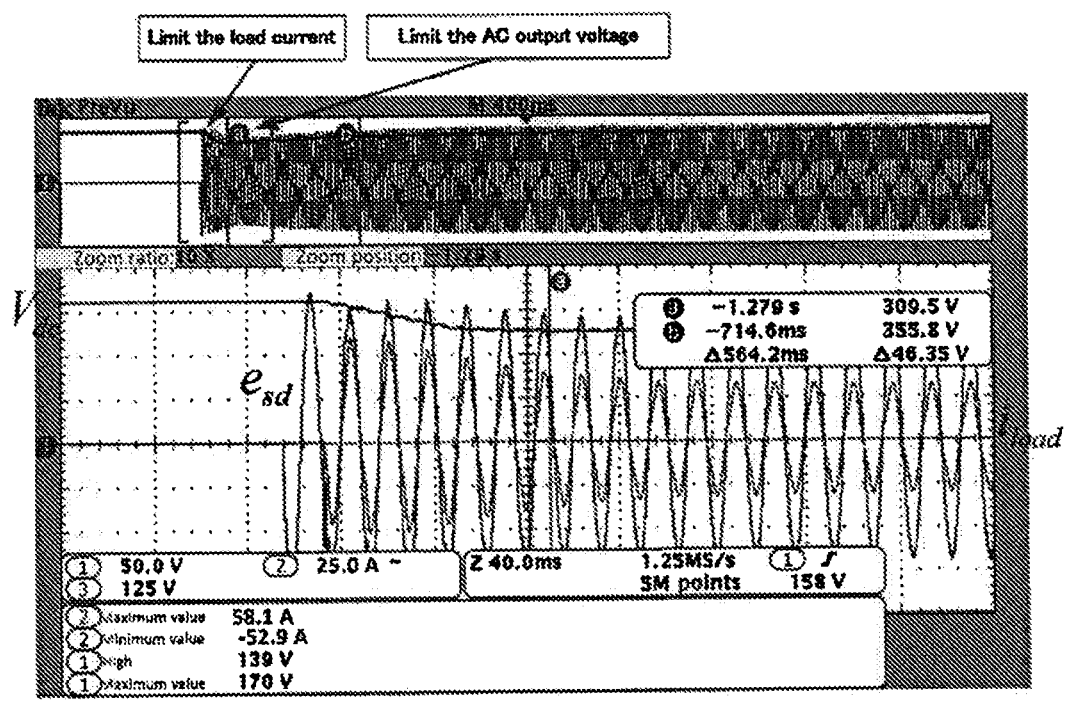
FIG. 10 is an explanatory graph of test results on the grid independent operation control algorithm.

FIG. 10 indicates test results for evaluation of output voltage control properties in an overload state, in a case where the above grid independent operation control method is applied. FIG. 9(a) indicates set values of circuit parameters in the test. FIG. 9(b) is a list of household loads applied for checking performance of a control system for grid independent operation.

FIG. 10 indicates test results in cases where power is supplied under load conditions 1 to 3 of FIG. 9(b). It was found that the load current $i_{load}$ is limited and the stand-alone power system voltage $e_{sd}$ has an amplitude value suppressed simultaneously in a case where a home-use cleaner and two dryers are driven momentarily upon supply of the stand-alone power system voltage. It was subsequently found that the load current for driving all household loads is suppressed and the stand-alone power system voltage is suppressed simultaneously, to recover gradually. There was found no over current error in this case.

Figure 11:
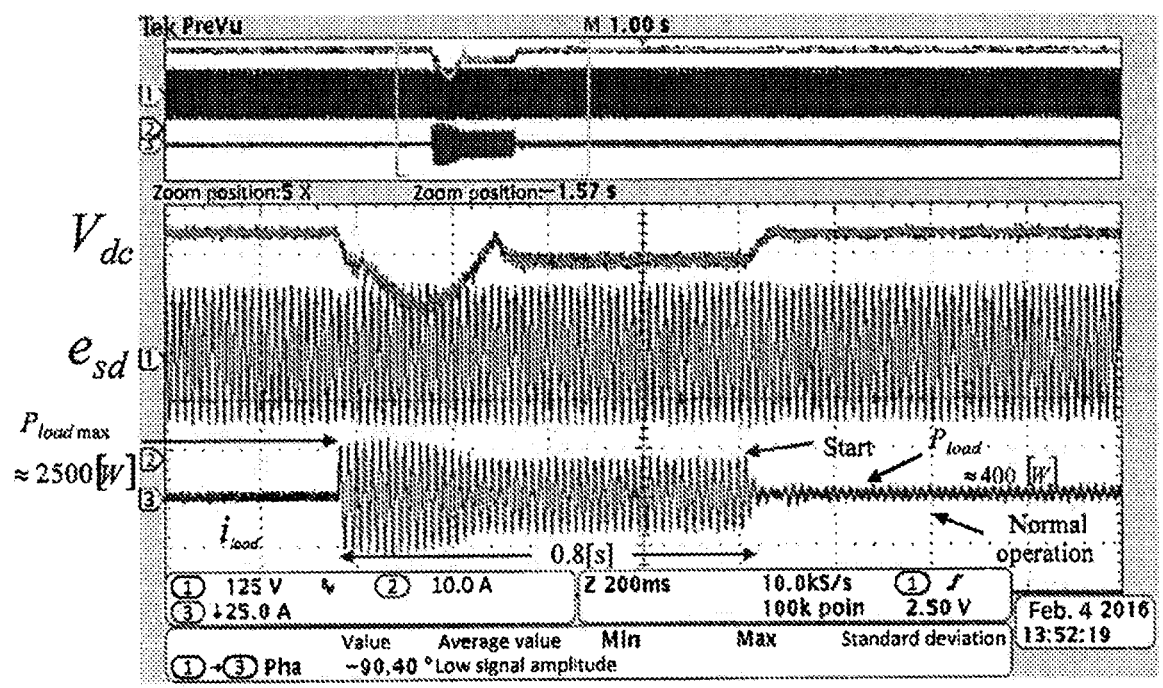
FIG. 11 is an explanatory graph of a test result on the grid independent operation control algorithm.

FIG. 11 indicates a test result only under a load condition 4 (a refrigerator) of FIG. 9(b). Under the load condition 4, it was found that supply of output power of at least 2000 W was required in about 0.8 seconds in order to drive a compressor of the refrigerator. Furthermore, maximum output power was found to be about 2500 W. It is indicated that a motor loading device such as a refrigerator is dealt through adoption of the control system and dual error handling according to the present invention. It was further found that about 400 W was consumed in a steady state after the start.

The embodiments described above merely exemplify the grid independent operation control unit for the distributed power supply, the power conditioner, and the grid independent operation control method according to the present invention. The description is not intended to limit the technical scope of the present invention. It is obvious that specific control algorithm, a hardware configuration for control, and the like can appropriately be modified in design as long as the functional effects of the present invention are exerted.

REFERENCE SIGNS LIST

1: Distributed power supply
2: DC/DC converter
3: Inverter
4: LC filter
50: Grid independent operation control unit
51, 52: Load current estimator
53: AC output voltage controller
54: AC output current controller
100: Commercial system power supply
PC: Power conditioner
SP: Solar panel
S1, S2, S3, S4: Switching element included in inverter bridge
$S_{PV}$: Switching element of DC/DC converter for solar panel
$S_{BAT}$: Switching element of bidirectional DC/DC converter for direct battery

The invention claimed is:

1. A grid independent operation controller for incorporation in a distributed power supply that includes an inverter configured to convert a received DC bus voltage $V_{dc}$ to an AC output voltage, and an LC filter configured to remove a harmonic component from output of the inverter, and is configured to execute grid connected operation or grid independent operation, the grid independent operation controller comprising:

a computer configured to:
estimate a load current $i_{load}$ supplied to stand-alone power system in accordance with a following mathematical Expression 1, and an output current $i_{inv}$ of the inverter and an output voltage $e_{sd}$;

PWM control the inverter at a duty ratio feedback calculated to cause the inverter to output an output voltage command value $e^*_{sd}$ in accordance with the output voltage $e_{sd}$ and the load current $i_{load}$; and PWM control the inverter at a duty ratio $u^*_d$ feedback calculated for output of a normalized output voltage command value $x^*_{sd}$ obtained by normalizing the output voltage command value $e^*_{sd}$ with the DC bus voltage $V_{dc}$ in accordance with a normalized output voltage $x_{sd}$ obtained by normalizing the output voltage $e_{sd}$ with the DC bus voltage $V_{dc}$ and a normalized load current $x_{load}$ obtained by normalizing the load current $i_{load}$ with the DC bus voltage $V_{dc}$, $$\begin{cases} i_{load} = i_{inv} - i_c \\ i_c = \dfrac{sC_f}{sR_cC_f+1} \cdot e_{sd} \end{cases} \quad \text{[Expression 1]}$$

where $C_f$ is a capacitance of a capacitor of the LC filter, $i_c$ is a current flowing to the capacitor of the LC filter, s is a Laplacian operator, and $R_c$ is an internal resistance.

2. The grid independent operation controller according to claim 1, wherein the normalized output voltage command value $x^*_{sd}$ is limited in accordance with a following mathematical Expression 2, with a coefficient a, where a is a real number in a range of 1≤a≤2, and a DC bus voltage $V_{dc.ini}$ immediately before start of grid independent operation, $$x^*_{sd} = \min\left\{\dfrac{e^*_{sd}}{V_{dc}}, a \cdot \dfrac{e^*_{sd}}{V_{dc.ini}}\right\}. \quad \text{[Expression 2]}$$

3. The grid independent operation controller according to claim 1, wherein the normalized load current $x_{load}$ is limited in accordance with a following mathematical Expression 3, with a coefficient b, where b is a real number in a range of 1≤b≤2, rated output power $P_{sd.rated}$, and a maximum value $E^*_{sd.max}$ of a stand-alone power system voltage command value, $$x_{load} = \min\left\{\dfrac{i_{load}}{V_{dc}}, 2b \cdot \dfrac{P_{sd.rated}}{E^*_{sd.max}}\right\}. \quad \text{[Expression 3]}$$

4. The grid independent operation controller according to claim 1, wherein the computer is configured to:
feedback calculate a normalized output current command value $x^*_{inv}$ obtained by normalizing an output current command value $i^*_{inv}$ of the inverter with the DC bus voltage $V_{dc}$ to keep the normalized output voltage $x_{sd}$ at the normalized output voltage command value $x^*_{sd}$; and
feedback calculate the duty ratio $u^*_d$ of the inverter to cause the inverter to output the normalized output voltage command value $x^*_{sd}$ in accordance with the normalized output current command value $x^*_{inv}$, a normalized output current $x_{inv}$ obtained by normalizing the output current $i_{inv}$ of the inverter with the DC bus voltage $V_{dc}$, and the normalized load current $x_{load}$.

5. The grid independent operation controller according to claim 1, wherein the computer is configured to estimate a normalized branch current $x_c$ obtained by normalizing a branch current $i_c$ flowing to a capacitor of the LC filter with the DC bus voltage $V_{dc}$ in accordance with the normalized output current $x_{inv}$ obtained by normalizing the output current $i_{inv}$ of the inverter with the DC bus voltage $V_{dc}$ and the normalized output voltage $x_{sd}$, and calculate the normalized load current $x_{load}$ by subtracting the normalized branch current $x_c$ from the normalized output current $x_{inv}$.

6. The grid independent operation controller according to claim 1, wherein the computer is configured to stop the inverter if the load current $i_{load}$ exceeds a maximum current $I_{max}$ of a switching element of the inverter during a first predetermined period immediately after start of grid independent operation.

7. The grid independent operation controller according to claim 6, wherein the computer is configured to stop the inverter if power exceeds a power threshold more than the rated output power during a second predetermined period after elapse of the first predetermined period.

8. The grid independent operation controller according to claim 1, wherein
the distributed power supply further includes a storage battery, and a DC converter configured to charge or discharge the storage battery, and
the computer is configured to:
feedback calculate an output current command value $i^*_{BAT}$ of the DC converter to keep the DC bus voltage $V_{dc}$ at a predetermined target DC bus voltage command value $V^*_{dc}$, and
PWM control the DC converter at a duty ratio $d^*_{BAT}$ of the DC converter feedback calculated to cause the DC converter to output the target DC bus voltage command value $V^*_{dc}$ in accordance with the output current command value $i^*_{BAT}$ and an output current $i_{BAT}$ of the DC converter.

9. A power conditioner comprising:
an inverter configured to convert a received DC bus voltage $V_{dc}$ to an AC output voltage;
an LC filter configured to remove a harmonic component from output of the inverter; and
a grid independent operation controller configured to execute grid connected operation or grid independent operation and control the output voltage of the inverter, the grid independent operation controller comprising:
a computer configured to:
estimate a load current $i_{load}$ supplied to stand-alone power system in accordance with a following mathematical Expression 1, and an output current $i_{inv}$ of the inverter and an output voltage $e_{sd}$;

PWM control the inverter at a duty ratio feedback calculated to cause the inverter to output an output voltage command value $e^*_{sd}$ in accordance with the output voltage $e_{sd}$ and the load current $i_{load}$; and PWM control the inverter at a duty ratio $u^*_d$ feedback calculated for output of a normalized output voltage command value $x^*_{sd}$ obtained by normalizing the output voltage command value $e^*_{sd}$ with the DC bus voltage $V_{dc}$ in accordance with a normalized output voltage $x_{sd}$ obtained by normalizing the output voltage $e_{sd}$ with the DC bus voltage $V_{dc}$ and a normalized load current $x_{load}$ obtained by normalizing the load current $i_{load}$ with the DC bus voltage $V_{dc}$, $$\begin{cases} i_{load} = i_{inv} - i_c \\ i_c = \dfrac{sC_f}{sR_cC_f + 1} \cdot e_{sd} \end{cases} \quad \text{[Expression 1]}$$

where $C_f$ is a capacitance of a capacitor of the LC filter, $i_c$ is a current flowing to the capacitor of the LC filter, s is a Laplacian operator, and $R_c$ is an internal resistance.

10. A grid independent operation control method executed by a grid independent operation controller incorporated in a distributed power supply that includes an inverter configured to convert a received DC bus voltage $V_{dc}$ to an AC output voltage and an LC filter configured to remove a harmonic component from output of the inverter and is configured to execute grid connected operation or grid independent operation, the grid independent operation control method comprising:

estimating a load current $i_{load}$ supplied to stand-alone power system in accordance with a following mathematical Expression 1, and an output current $i_{inv}$ of the inverter and an output voltage $e_{sd}$;

PWM controlling the inverter at a duty ratio feedback calculated to cause the inverter to output an output voltage command value $e^*_{sd}$ in accordance with the output voltage $e_{sd}$ and the load current $i_{load}$; and PWM controlling the inverter at a duty ratio $u^*_d$ feedback calculated for output of a normalized output voltage command value $x^*_{sd}$ obtained by normalizing the output voltage command value $e^*_{sd}$ with the DC bus voltage $V_{dc}$ in accordance with a normalized output voltage $x_{sd}$ obtained by normalizing the output voltage $e_{sd}$ with the DC bus voltage $V_{dc}$ and a normalized load current $x_{load}$ obtained by normalizing the load current $i_{load}$ with the DC bus voltage $V_d$, $$\begin{cases} i_{load} = i_{inv} - i_c \\ i_c = \dfrac{sC_f}{sR_cC_f + 1} \cdot e_{sd} \end{cases} \quad \text{[Expression 1]}$$

where $C_f$ is a capacitance of a capacitor of the LC filter, $i_c$ is a current flowing to the capacitor of the LC filter, s is a Laplacian operator, and $R_c$ is an internal resistance.

11. The grid independent operation control method according to claim 10, wherein the normalized output voltage command value $x^*_{sd}$ has a value limited in accordance with a following mathematical Expression 2, with a coefficient a, where a is a real number in a range of $1 \le a \le 2$, and and a DC bus voltage $V_{dc.ini}$ immediately before start of grid independent operation, $$x^*_{sd} = \min\left\{ \dfrac{e^*_{sd}}{V_{dc}}, a \cdot \dfrac{e^*_{sd}}{V_{dc.ini}} \right\}. \quad \text{[Expression 2]}$$

12. The grid independent operation control method according to claim 10, wherein the normalized load current $x_{load}$ has a value limited in accordance with a following mathematical Expression 3, with a coefficient b, where b is a real number in a range of $1 \le b \le 2$, rated output power $P_{sd.rated}$, and a maximum value $E^*_{sd.max}$ of a stand-alone power system voltage command value, $$x_{load} = \min\left\{ \dfrac{i_{load}}{V_{dc}}, 2b \cdot \dfrac{P_{sd.rated}}{E^*_{sd.max}} \right\}. \quad \text{[Expression 3]}$$

13. The grid independent operation control method according to claim 10, further comprising:

feedback calculating a normalized output current command value $x^*_{inv}$ obtained by normalizing an output current command value $i^*_{inv}$ of the inverter with the DC bus voltage $V_{dc}$ to keep the normalized output voltage $x_{sd}$ at the normalized output voltage command value $x^*_{sd}$; and feedback calculating the duty ratio $u^*_d$ of the inverter to cause the inverter to output the normalized output voltage command value $x^*_{sd}$ in accordance with the normalized output current command value $x^*_{inv}$, a normalized output current $x_{inv}$ obtained by normalizing the output current $i_{inv}$ of the inverter with the DC bus voltage $V_{dc}$, and the normalized load current $x_{load}$.

14. The grid independent operation control method according to claim 10, further comprising:

estimating a normalized branch current x, obtained by normalizing a branch current $i_c$ flowing to a capacitor of the LC filter with the DC bus voltage $V_{dc}$ in accordance with the normalized output current $x_{inv}$ obtained by normalizing the output current $i_{inv}$ of the inverter with the DC bus voltage $V_{dc}$ and the normalized output voltage $x_{sd}$, and calculating the normalized load current $x_{load}$ by subtracting the normalized branch current $x_c$ from the normalized output current $x_{inv}$.

15. The grid independent operation control method according to claim 10, further comprising:

stopping the inverter if the load current $i_{load}$ exceeds a maximum current $I_{max}$ of a switching element of the inverter during a first predetermined period immediately after start of grid independent operation.

16. The grid independent operation control method according to claim 15, further comprising:

stopping the inverter if power exceeds a power threshold more than the rated output power during a second predetermined period after elapse of the first predetermined period.

17. The grid independent operation control method according to claim 10, wherein the distributed power supply further includes a storage battery, and a DC converter configured to charge or discharge the storage battery, and the grid independent operation control method further comprises:

feedback calculating an output current command value $i^*_{BAT}$ of the DC converter to keep the DC bus voltage $V_{dc}$ at a predetermined target DC bus voltage command value $V^*_{dc}$; and PWM controlling the DC converter at a duty ratio $d^*_{BAT}$ of the DC converter feedback calculated to cause the DC converter to output the target DC bus voltage command value $V^*_{dc}$ in accordance with the output current command value $i^*_{BAT}$ and an output current $i_{BAT}$ of the DC converter.

* * * * *